United States Patent
Mizobe et al.

(10) Patent No.: US 8,497,728 B2
(45) Date of Patent: Jul. 30, 2013

(54) ELECTRONIC CONTROL APPARATUS HAVING SWITCHING ELEMENT AND DRIVE CIRCUIT

(75) Inventors: Shunichi Mizobe, Kariya (JP); Tsuneo Maebara, Nagoya (JP); Kazunori Watanabe, Kariya (JP)

(73) Assignee: Denso Corporation, Kariya (JP)

( * ) Notice: Subject to any disclaimer, the term of this patent is extended or adjusted under 35 U.S.C. 154(b) by 19 days.

(21) Appl. No.: 13/357,828

(22) Filed: Jan. 25, 2012

(65) Prior Publication Data

US 2012/0188001 A1    Jul. 26, 2012

(30) Foreign Application Priority Data

Jan. 25, 2011   (JP) .................................. 2011-013248

(51) Int. Cl.
    *H03K 17/687*    (2006.01)

(52) U.S. Cl.
    USPC ............. 327/427; 327/110; 327/478; 326/83; 326/89

(58) Field of Classification Search
    USPC ................. 327/108–110, 419, 427, 429, 432, 327/434, 437, 478–480, 482; 326/82, 83, 326/87, 89, 91
    See application file for complete search history.

(56) References Cited

U.S. PATENT DOCUMENTS

| | | | |
|---|---|---|---|
| 6,271,709 B1* | 8/2001 | Kimura et al. | 327/380 |
| 7,535,283 B2* | 5/2009 | Kojima | 327/538 |
| 2012/0025875 A1* | 2/2012 | Fukuta et al. | 327/109 |
| 2012/0075761 A1* | 3/2012 | Miura et al. | 361/93.1 |
| 2012/0126858 A1* | 5/2012 | Senda et al. | 327/108 |
| 2012/0126859 A1* | 5/2012 | Kawamoto et al. | 327/108 |
| 2012/0176117 A1* | 7/2012 | Watanabe et al. | 323/312 |
| 2012/0242376 A1* | 9/2012 | Ose et al. | 327/109 |

FOREIGN PATENT DOCUMENTS

JP    P2007-288856 A    11/2007

* cited by examiner

*Primary Examiner* — William Hernandez
(74) *Attorney, Agent, or Firm* — Nixon & Vanderhye PC

(57) ABSTRACT

An electronic control apparatus includes a switching element having a control terminal; an ON-drive constant-current circuit for supplying a constant current to the control terminal, thereby charging the control terminal of the switching element with electrical charge; an OFF-drive switching element for discharging electrical charge from the control terminal of the switching element by being turned ON; and a control circuit adapted to control the ON-drive constant-current circuit and the OFF-drive switching element in response to a drive signal being inputted, thereby controlling the voltage of the control terminal of the switching element to drive the switching element. The ON-drive constant-current circuit includes a current control transistor and a current detection element. The control circuit controls the current control transistor based on the voltage of the current detection resistor and detects abnormality in the ON-drive constant-current circuit based on a source-drain voltage of the current control transistor.

12 Claims, 3 Drawing Sheets

ELECTRONIC CONTROL APPARATUS HAVING SWITCHING ELEMENT AND DRIVE CIRCUIT

CROSS REFERENCE TO RELATED APPLICATION

This application is based on and claims the benefit of priority from earlier Japanese Patent Application No. 2011-13248 filed on Jan. 25, 2011 the description of which is incorporated herein by reference.

BACKGROUND

1. Technical Field

The present application relates to an electronic control apparatus having a switching element and a drive circuit, and more particularly to an electronic control apparatus used for driving motors and capable of detecting faults of the drive circuit.

2. Description of the Related Art

Conventionally, an electronic control apparatus having a switching element and a drive circuit have been employed. For example, Japanese Patent Application Laid-Open Publication No. 2007-288856 discloses a motor drive unit as an electronic control apparatus.

The motor drive unit disclosed in the above patent document includes a power transistor and a gate driver. The gate driver includes first and second current sources, a gate-current control device and a gate switching control device. The first current source is connected between the positive terminal of the power supply unit and the gate terminal of the power transistor. The second current source is connected between the gate terminal of the power transistor and the negative terminal of the power supply unit. The gate current-control device is connected to the first and second current sources. The gate switching control device is connected to the gate-current control device.

The gate current control device is adapted to drive the first power transistor by controlling the first and second current sources based on the signal inputted by the gate switching control device. In response to the signal inputted from the gate switching control device commanding the power transistor to be turned ON, the gate current control device controls the first current source to supply predetermined current into the gate. As a result, the gate voltage exceeds the threshold voltage that determines ON-OFF switching whereby the power transistor turns ON.

Meanwhile, in response to the signal inputted from the gate switching control device commanding the power transistor to be turned OFF, the gate current control device controls the second current source to sink predetermined current from the gate. As a result, the gate voltage becomes lower than the threshold voltage whereby the power transistor turns OFF.

In the above-described motor drive unit, when the first current source is in a faulty condition, the gate voltage of the power transistor does not decrease so that an abnormal condition where the power transistor cannot be turned OFF may occur. In this case, when the gate voltage of the power transistor is within a predetermined range which is close to the threshold voltage, the source-drain voltage (turn-ON voltage) of the power transistor increases so that heat produced by the power transistor increases as well. Therefore, if such an abnormal condition continues, the power transistor may be damaged by excessive heat.

SUMMARY

An embodiment provides an electronic control apparatus capable of detecting an abnormality in an ON-drive constant current circuit used for charging a control terminal of a switching element by supplying a constant current to turn ON the switching element.

Through keen research conducted to solve the above-described issues, the inventors of the present application have found that, in an ON-drive constant-current circuit configured by a constant-current output transistor and a current detection resistor that detects a current flowing to the constant-current output transistor, an abnormality in the ON-drive constant-current circuit can be detected based on the voltage of the constant-current output transistor.

As a first aspect, an electronic control apparatus includes: a switching element having a control terminal, the switching element being driven by a voltage at the control terminal; an ON-drive constant-current circuit connected to the control terminal of the switching element, supplying a constant current to the control terminal thereby charging the control terminal of the switching element with electrical charge, the ON-drive constant-current circuit including a current control transistor that controls the current supplied to the control terminal of the switching element and a current detection resistor that detects the current flowing to the current control transistor, an input terminal of the current control transistor being connected to a drive power supply unit and an output terminal of the current control transistor being connected to the control terminal of the switching element, and the current detection resistor being connected to the current control transistor; an OFF-drive switching element connected to the control terminal of the switching element, discharging electrical charge from the control terminal of the switching element by being turned ON; and a control circuit adapted to control the ON-drive constant-current circuit and the OFF-drive switching element in response to a drive signal being inputted, thereby controlling the voltage of the control terminal of the switching element so as to drive the switching element.

The control circuit is adapted to control the current control transistor based on the voltage of the current detection resistor and supplies the constant current to the control terminal of the switching element, and detects an abnormality in the ON-drive constant-current circuit based on a voltage between the input terminal of the current control transistor and the output terminal of the current control transistor.

According to this configuration, assuming the current control transistor or the current detection resistor of the ON-drive constant-current circuit is in faulty condition, current flowing through such a circuit component or the voltage applied to the circuit component varies. Therefore, the abnormality of the ON-drive constant-current circuit can be detected based on the voltage between the input terminal and the output terminal of the current control transistor.

As a second aspect, the control circuit of the electronic control apparatus detects an abnormality in the ON-drive constant-current circuit based on the drive signal and the voltage between the input terminal of the current control transistor and the output terminal of the current control transistor.

According to this configuration, assuming the current control transistor or the current detection resistor of the ON-drive constant-current circuit is in a faulty condition, current flowing through such a circuit component or the voltage applied to the circuit component varies. Moreover, the current-flowing and the applied voltage vary depending on a state of the drive signal. Hence, the abnormality of the ON-drive constant-current circuit can be detected based on the drive signal and the voltage between the input terminal and the output terminal of the current control transistor.

As a third aspect, the control circuit of the electronic control apparatus determines that a short-circuit has occurred in the current control transistor when the voltage between the input terminal and the output terminal of the current control transistor is 0 volts, while the drive signal is giving a command to supply the constant current from the ON-drive constant-current circuit to the control terminal of the switching element.

According to this configuration, while the drive signal is giving a command to supply the constant current from the ON-drive constant-current circuit to the control terminal of the switching element, the voltage between the input terminal and the output terminal of the current control transistor becomes a predetermined value depending on an amount of the constant current flowing into the control terminal of the switching element. However, if short-circuit has occurred in the current control transistor, the voltage between the input terminal and the output terminal of the current control transistor becomes 0 volts. Therefore, the control circuit can determine the short-circuit fault of the current control transistor when the voltage between the input terminal and the output terminal of the current control transistor is 0 volts.

As a fourth aspect, while the drive signal is giving a command to supply the constant current from the ON-drive constant-current circuit to the control terminal of the switching element, when the voltage between the input terminal and the output terminal of the current control transistor is greater than a predetermined threshold voltage, the control circuit determines that a short-circuit has occurred in the OFF-drive switching element or that the OFF-drive switching element is turned ON due to a fault of a control portion in the control circuit that controls the OFF-drive switching element.

According to this configuration, while the drive signal is giving a command to supply the constant current from the ON-drive constant-current circuit to the control terminal of the switching element, the voltage between the input terminal and the output terminal of the current control transistor becomes a predetermined value depending on an amount of the constant current flowing into the control terminal of the switching element. However, when the OFF-drive switching element has a short-circuit fault or the OFF-drive switching element is turned ON due to a fault of a control portion in the control circuit that controls the OFF-drive switching element, the voltage between the input terminal and the output terminal of the current control transistor becomes greater than a predetermined threshold voltage. Hence, the control circuit can determine that a short-circuit has occurred in the OFF-drive switching element or the OFF-drive switching element is turned ON due to a fault of a control portion in the control circuit that controls the OFF-drive switching element when the voltage between the input terminal and the output terminal of the current control transistor is greater than a predetermined threshold voltage.

As a fifth aspect, while the drive signal is giving a command to turn ON the OFF-drive switching element, when the voltage between the input terminal and the output terminal of the current control transistor is smaller than the voltage when the constant current is not supplied to the control terminal, the control circuit determines that a short-circuit has occurred in the current control transistor or that the current control transistor is turned ON due to a fault of a control portion in the control circuit that controls the current control transistor.

According to this configuration, while the drive signal is giving a command to turn ON the OFF-drive switching element, the ON-drive constant-current circuit stops supplying the constant current to the control terminal of the switching element so that the voltage between the input terminal and the output terminal of the current control transistor becomes a predetermined voltage corresponding to a voltage when the constant-current is not supplied. However, when the current control transistor has a short-circuit fault or the current control transistor is turned ON due to a fault of a control portion in the control circuit that controls the current control transistor, the voltage between the input terminal and the output terminal of the current control transistor becomes smaller than the voltage when the constant-current is not supplied to the control terminal. Therefore, the control circuit can determine that a short-circuit has occurred in the current control transistor or the current control transistor is turned ON due to a fault of a control portion in the control circuit that controls the current control transistor, when the voltage between the input terminal and the output terminal of the current control transistor is smaller than the voltage when the constant current is not supplied to the control terminal.

As a sixth aspect, the input terminal of the current control transistor is connected to a positive terminal of the drive power supply unit via the current detection resistor and connected to a negative terminal of the drive power supply unit via a first reference resistor, and the output terminal of the current control transistor is connected to a negative terminal of the drive power supply unit via a second reference resistor.

According to this configuration, even when the ON-drive constant-current circuit is faulty, the voltage between the input terminal and the output terminal of the current control transistor becoming unstable can be avoided. Therefore, abnormality of the ON-drive constant-current circuit can be reliably detected based on the voltage of the current control transistor.

As a seventh aspect, while the drive signal is giving a command to turn ON the OFF-drive switching element, when the voltage between the input terminal and the output terminal of the current control transistor is a voltage divided by the current detection resistor and the first reference resistor from a voltage of the drive power supply unit, the control circuit determines that an open fault has occurred in the current control transistor.

According to this configuration, while the drive signal is giving a command to turn ON the OFF-drive switching element, the ON-drive constant-current circuit stops supplying the constant current into the control terminal of the switching element so that the voltage between the input terminal and the output terminal of the current control transistor becomes a predetermined voltage corresponding to a voltage when the constant-current is not supplied. However, when the current control transistor has an open fault, since the input terminal is connected to the positive terminal of the drive power supply unit via the current detection resistor and connected to the negative terminal of the drive power supply unit via the first reference resistor, and the output terminal is connected to the negative terminal of the drive power supply unit via the second reference resistor, the voltage between the input terminal and the output terminal equals to a voltage divided by the current detection resistor and the first reference resistor from the voltage of the drive power supply unit. Therefore, the control circuit can determine that an open fault has occurred in the current control transistor when the voltage between the input terminal and the output terminal of the current control transistor is a voltage divided by the current detection resistor and the first reference resistor from a voltage of the drive power supply unit.

As an eighth aspect, the control circuit determines that an open fault has occurred in the current detection resistor when the voltage between the input terminal and the output terminal of the current control transistor is 0 volts, while the drive signal is giving a command to supply the constant current from the ON-drive constant-current circuit to the control terminal of the switching element.

According to this configuration, while the drive signal is giving a command to supply the constant current from the ON-drive constant-current circuit to the control terminal of the switching element, the voltage between the input terminal and the output terminal of the current control transistor becomes a predetermined voltage based on an amount of the constant current. However, when the current detection resistor has an open fault, current does not flow through the current control transistor. Since the input terminal of the current control transistor is connected to the negative terminal of the drive power supply circuit via the first reference resistor and the output terminal of the current control transistor is connected to the drive power supply circuit via the second reference resistor, the voltage between the input terminal and the output terminal of the current control transistor becomes 0 volts. Accordingly, when the voltage between the input terminal and the output terminal of the current control transistor is 0 volts, the control circuit can determine that an open fault has occurred at the current detection resistor.

As a ninth aspect, the control circuit includes: a current control circuit for controlling the current control transistor based on the voltage of the current detection resistor; and an abnormality detection circuit for detecting an abnormality in the ON-drive constant-current circuit based on the voltage between the input terminal and the output terminal of the current control transistor, and wiring from the current detection resistor to the current control circuit and the wiring from the current control transistor to the abnormality detection circuit are provided separately.

According to this configuration, the current detection resistor is connected to the current control transistor. Therefore, the wiring from the current detection resistor to the current control circuit, and the wiring from the current control transistor to the abnormality detection circuit can be partly shared. However, both wirings are provided separately without sharing the wirings. As a result, even if the wiring between the current detection resistor and the current control circuit is broken, the control circuit can detect abnormality of the ON-drive constant-current circuit.

As a tenth aspect, the control circuit turns OFF the switching element by a component other than the OFF-drive switching element when an abnormality in the ON-drive constant-current circuit is detected.

According to the configuration, thermal fracture of the switching element accompanying the abnormality in the ON-drive constant-current circuit can be prevented.

As a eleventh aspect, the electronic control apparatus includes an OFF-holding switching element connected to the control terminal of the switching element and adapted to discharge electrical charge from the control terminal of the switching element by being turned ON, and the control circuit is adapted to control the OFF-holding switching element such that when the voltage of the control terminal of the switching element becomes an OFF-holding threshold or less, the OFF-holding threshold being lower than an ON/OFF threshold voltage, the control circuit controls the OFF-holding switching element so as to hold the OFF-state of the switching element, and when an abnormality in the ON-drive constant-current circuit is detected, the control circuit controls the OFF-holding switching element so as to turn OFF the switching element.

According to the configuration, when an abnormality is detected in the ON-drive constant-current circuit, the switching element is turned OFF by the OFF-holding switching element being controlled and electrical charge being discharged from the control terminal of the switching element. Therefore, thermal fracture of the switching element can be prevented.

As a twelfth aspect, the control circuit outputs an abnormality signal when the control circuit detects an abnormality in the ON-drive constant-current circuit.

According to the configuration, notification of the abnormality in the ON-drive constant current circuit can be given outside.

The first and second reference resistors are expediently implemented to discriminate resistors used for connecting the reference potential.

BRIEF DESCRIPTION OF THE DRAWINGS

In the accompanying drawings.

DETAILED DESCRIPTION OF THE PREFERRED EMBODIMENTS

Hereinafter will be described an embodiment of the present invention. According to the embodiment, the electronic control apparatus of the present invention is adapted to an on-vehicle motor control device that controls vehicle-drive motor.

Figure 1:
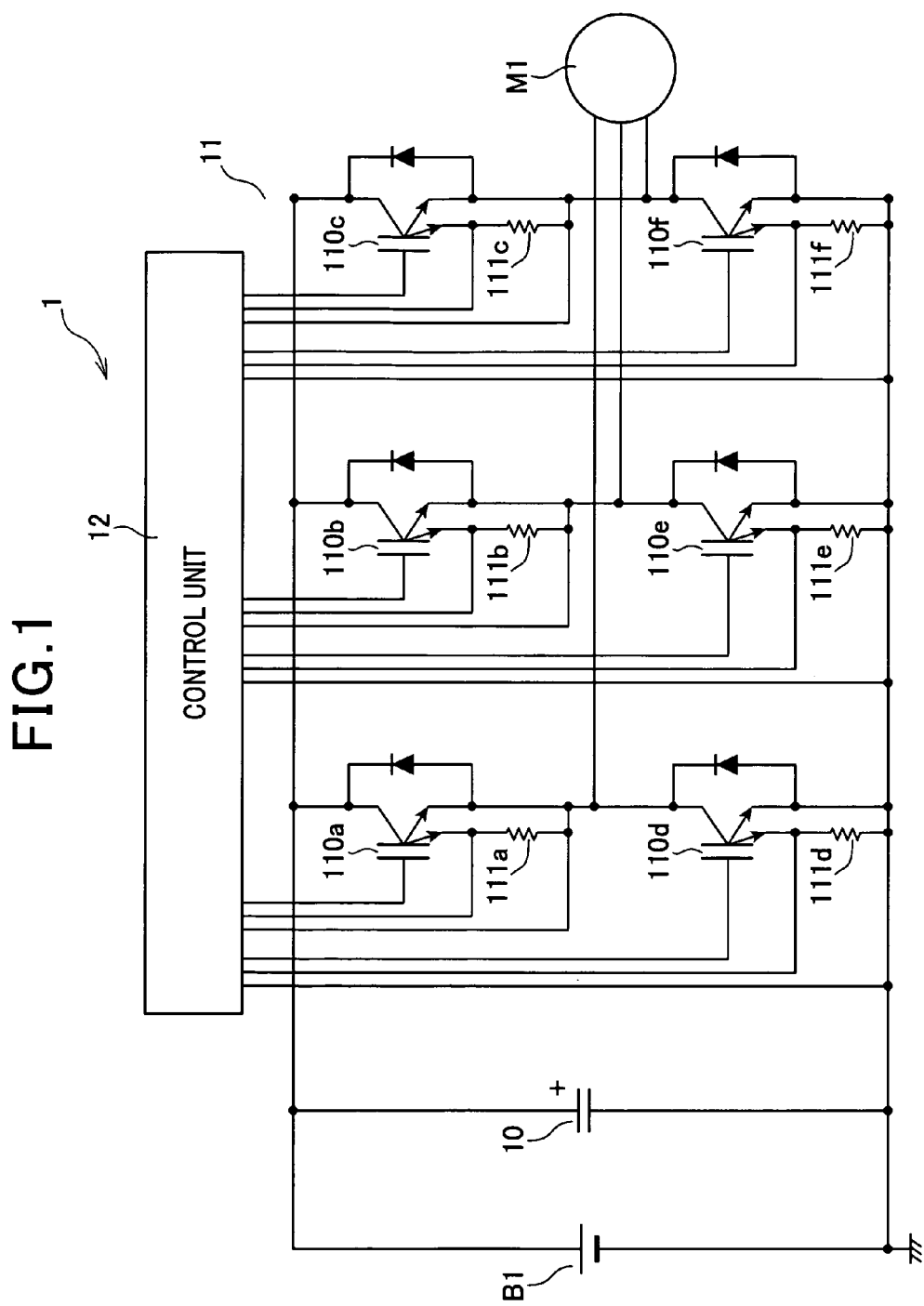
FIG. 1 is a circuit diagram showing a motor control device.

With reference to FIG. 1, the motor control device according to the embodiment is described as follows. FIG. 1 is a circuit diagram showing the motor control device according to the embodiment.

The motor control device 1 as shown in FIG. 1 (electronic control apparatus) is adapted to control a vehicle-drive-motor M1 such that the motor control device 1 converts DC (direct current) high voltage (e.g. 288 volts) outputted by a high voltage battery B1 which is isolated from the vehicle-body into three phase AC (alternate current) voltage and supplies the converted AC voltage to the vehicle-drive-motor M1. The vehicle-drive-motor M1 includes a smoothing capacitor 10, an inverter unit 11 and a control unit 12.

The smoothing capacitor 10 smoothes the DC high voltage of the high voltage battery B1. The one end of the smoothing capacitor 10 is connected to the positive terminal of the high voltage battery B1. The other end of the smoothing capacitor 10 is connected to the negative terminal of the high voltage battery B1. Further, the negative terminal of the high voltage battery B1 is connected to the ground terminal used for the high voltage battery that is isolated from the vehicle-body.

The inverter unit 11 converts the DC voltage smoothed by the smoothing capacitor 10 into three phase AC voltage and supplies the vehicle-drive-motor M1 with the three phase AC voltage. The inverter unit 11 includes IGBTs 110a, 110b, 110c, 110d, 110e and 110f (switching element), and current sense resistors 111a, 111b, 111c, 111d, 111e and 111f.

The IGBTs 110a, 110b, 110c, 110d, 110e and 110f are used as switching elements to convert the DC voltage smoothed by the smoothing capacitor 10 into the three phase AC voltage. The IGBTs 110a to 110f are driven by controlling the gate terminal (control terminal) so as to turn ON and OFF of the IGBTs 110a to 110f whereby the smoothed DC voltage is converted into the three phase AC voltage. The IGBTs 110a to 119f include a current sense terminal at which a small amount of current which is proportional to the collector current and smaller than the collector current flows. The IGBTs 110a to 110f are connected in series. Specifically, the emitter terminals of the IGBTs 110a, 110b and 110c are connected to the collector terminals of the IGBTs 110d, 110e and 110f respectively. Three pairs of series-connected IGBTs 110a and 110d, 110b and 110e, and 110c and 110f are connected in parallel. The collectors of the IGBTs 110a, 110b and 110c are connected to one end of the smoothing capacitor 10 and the emitters of the IGBTs 110d, 110e and 110f are connected to the other end of the smoothing capacitor 10. The gate and emitter terminals of the IGBTs 110a to 110f are connected to the control unit 12. Moreover, series-connected points of the respective series-connected IGBT pairs 110a and 110d, 110b and 110e, and 110c and 110f are connected to the vehicle-drive-motor M1.

The current sense resistors 111a to 111f are adapted to convert corresponding current flowing through the IGBTs 110a to 110f into voltage signals. Specifically, the current sense resistors convert the current flowing through the current sense terminal into voltage signals. The one ends of the current sense resistors 111a to 111f are connected to the current sense terminals of the IGBTs 110a to 110f, and the other ends of the sense resistors 111a to 111f are connected to the emitter terminals of the IGBTs 110a to 110f respectively. Both ends of the current sense resistors 111a to 111f are connected to the control unit 12.

The control unit 12 is controls the IGBTs 110a to 110f. The control unit 12 is connected to the gate terminals and the emitter terminals of the IGBT 110a to 110f. The control unit 12 is connected to both ends of the current sense resistors 111a to 111f to detect current flowing through the IGBTs 110a to 110f.

Figure 2:
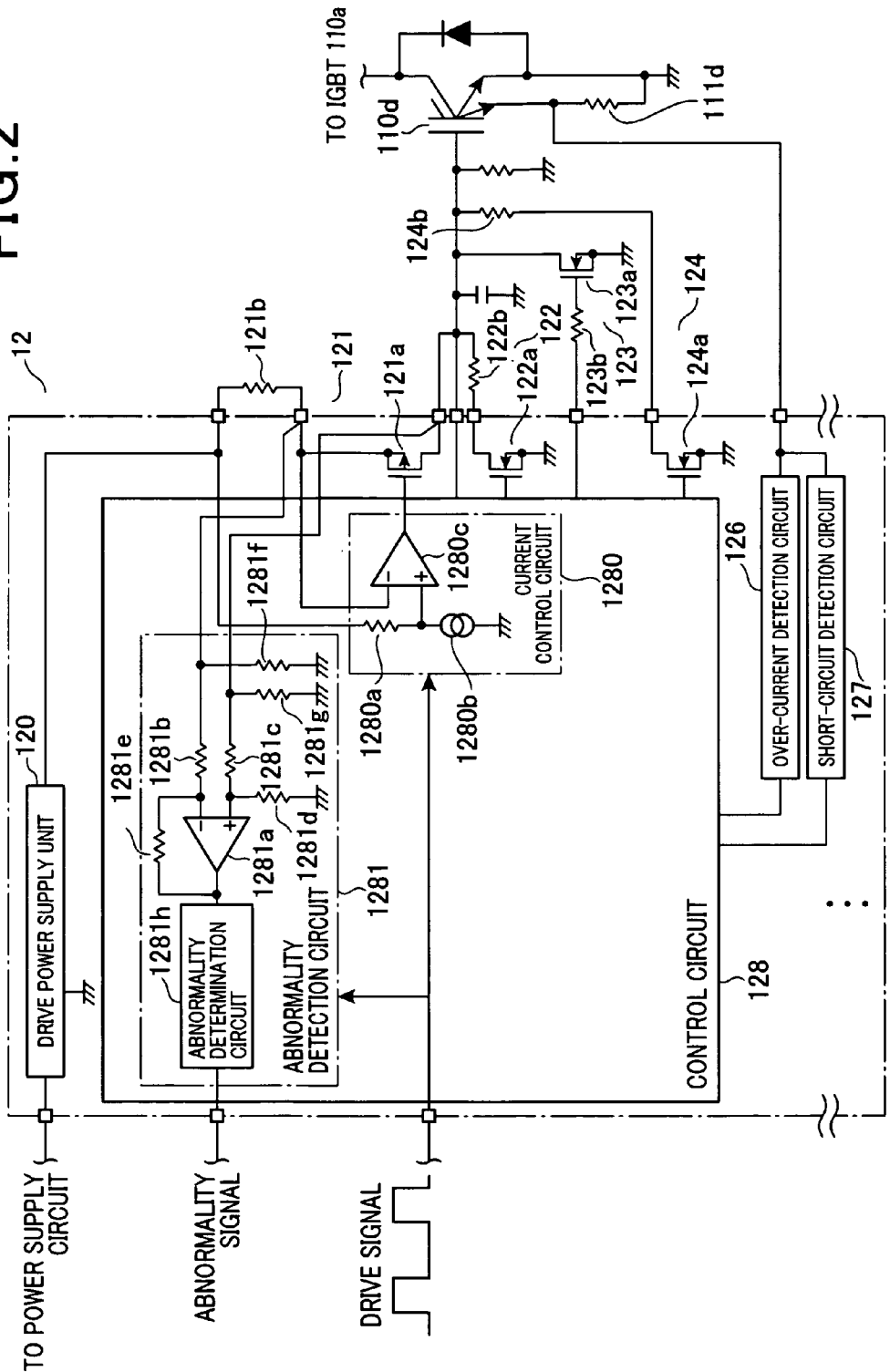
FIG. 2 is a circuit diagram showing a control device according to FIG. 1.

Next, a detail configuration of the control unit 12 is now described with reference to FIG. 2. Here, FIG. 2 is a circuit diagram showing a control unit 12 as shown in FIG. 1. Specifically, in FIG. 2, a circuit diagram for a single IGBT is shown.

As shown in FIG. 2, for the IGBT 110d, the control unit 12 includes a drive power supply unit 120, an ON-drive constant-current circuit 121, an OFF-drive circuit 122, an OFF-holding circuit 123, a blocking circuit 124, an over-current detecting circuit 126, a short-circuit detecting circuit 127 and a control circuit 128. Similarly, for other IGBTs 110a to 110c, 110e and 110f, the control unit 12 includes the drive-power supply, a drive power supply unit, an ON-drive constant-current circuit, an OFF-drive circuit, an OFF-holding circuit, a blocking circuit, an over-current detecting circuit, a short-circuit detecting circuit and a control circuit.

The drive-power supply unit 120 supplies voltage used to drive the IGBT 110d. The drive-power supply unit 120 regulates voltage from the power supply circuit (not shown) and outputs the regulated voltage. The input terminal of the drive-power supply unit 120 is connected to the power supply circuit. The positive terminal of the drive-power supply unit 120 is connected to the ON-drive constant-current circuit 121. The negative terminal of the drive-power supply unit 120 is connected to the high-voltage-battery ground that is isolated from the vehicle body, and is connected to the emitter of the IGBT 110d via the high-voltage-battery ground.

The ON-drive constant-current circuit 121 is a circuit used to turn ON the IGBT 110d. Specifically, the ON-drive constant-current circuit 121 charges the gate of the IGBT 110d with electrical charge by sourcing a predetermined constant current thereto, increases the gate voltage to become higher than an ON/OFF threshold voltage, and turns ON the IGBT 110d. The ON-drive constant-current circuit 121 includes a current control field-effect transistor (FET) 121a (current control transistor) and a current detection resistor 121b.

The current control FET 121a is an element that is driven by the voltage of the gate being controlled, and charges the gate of the IGBT 110d with electrical charge by sourcing a predetermined constant current. Specifically, the current control FET 121a is a P-channel metal-oxide-semiconductor field-effect transistor (MOSFET). The current detection resistor 121b (current detection element) is an element that detects the current supplied to the IGBT 110d. It is noted that the current detection resistor can be replaced to other elements that can detect amount of current supplied to the IGBT 110d. The source (input terminal) of the current control FET 121a is connected to the positive terminal of the drive power supply unit 120 with the current detection resistor 121b therebetween. The drain (output terminal) is connected to the gate of the IGBT 110d. Furthermore, the gate is connected to the control circuit 128.

The OFF-drive circuit 122 is a circuit used to turn OFF the IGBT 110d. Specifically, the OFF-drive circuit 122 discharges electrical charge from the gate of the IGBT 110d, decreases the gate voltage to become lower than the ON/OFF threshold voltage, and turns OFF the IGBT 110d. The OFF-drive circuit 122 includes an OFF-drive FET 122a (OFF-drive switching element) and an OFF-drive resistor 122b.

The OFF-drive FET 122a is a switching element that is driven by the voltage of the gate being controlled, and discharges electrical charge from the gate of the IGBT 110d by being turned ON. Specifically, the OFF-drive FET 122a is an N-channel MOSFET. The source of the OFF-drive FET 122a is connected to the high-voltage-battery ground that is insulated from the vehicle body, and is connected to the negative terminal of the drive power supply unit 120 and the emitter of the IGBT 110d with the high-voltage-battery ground therebetween. The drain is connected to the gate of the IGBT 110d with the OFF-drive resistor 122b therebetween. Furthermore, the gate is connected to the control circuit 128.

The OFF-holding circuit 123 is a circuit that holds the OFF-state of the IGBT 110d. Specifically, when the gate voltage of the IGBT 110d reaches an OFF-holding threshold or lower, the OFF-holding threshold being lower than the ON/OFF threshold voltage, the OFF-holding circuit 123 discharges electrical charge from the gate of the IGBT 110d more quickly than the OFF-drive circuit 122. The OFF-holding circuit 123 decreases the gate voltage to become lower than the ON/OFF threshold voltage, and holds the OFF-state of the IGBT 110d. The OFF-holding circuit 123 includes an OFF-holding FET 123a (OFF-holding switching element) and a gate resistor 123b.

The OFF-holding FET 123a is a switching element that is driven by the voltage of the gate being controlled, and discharges electrical charge from the gate of the IGBT 110d by being turned ON. Specifically, the OFF-holding FET 123a is an N-channel MOSFET. The source of the OFF-holding FET 123a is connected to the high-voltage-battery ground that is insulated from the vehicle body, and is connected to the negative terminal of the drive power supply unit 120 and the emitter of the IGBT 110d with the high-voltage-battery ground therebetween. The drain is connected to the gate of the IGBT 110d. Furthermore, the gate is connected to the control circuit 128 with the gate resistor 123b therebetween.

The blocking circuit 124 is a circuit that turns OFF the IGBT 110d in place of the OFF-drive circuit 122 when an abnormality occurs. Specifically, when an abnormality such as over current or a short-circuit occurs, the blocking circuit 124 discharges electrical charge from the gate of the IGBT 110d more gradually than the OFF-drive circuit 122. The block circuit 124 decreases the gate voltage to become lower than the ON/OFF threshold voltage, and turns OFF the IGBT 110d in place of the OFF-drive circuit 122. The blocking circuit 124 includes a blocking FET 124a and a blocking resistor 124b.

The blocking FET 124a is a switching element that is driven by the voltage of the gate being controlled, and discharges electrical charge from the gate of the IGBT 110d by being turned ON. Specifically, the blocking FET 124a is an N-channel MOSFET. The source of the blocking FET 124a is connected to the high-voltage-battery ground that is insulated from the vehicle body, and is connected to the negative terminal of the drive power supply unit 120 and the emitter of the IGBT 110d with the high-voltage-battery ground therebetween. The drain is connected to the gate of the IGBT 110d with the blocking resistor 124b therebetween. Furthermore, the gate is connected to the control circuit 128.

The over-current detection circuit 126 is a circuit that detects whether or not an over current is flowing to the IGBT 110d. Specifically, when the current flowing to the IGBT 110d becomes greater than an over current threshold, the over current detection circuit 126 determines that an over current is flowing to the IGBT 110d. The input terminal of the over current detection circuit 126 is connected to one end of the current-sensing resistor 111d. The output terminal is connected to the control circuit 128.

The short-circuit detection circuit 127 is a circuit that detects whether or not the IGBT 110d is in a short-circuit condition. Specifically, when the current flowing to the IGBT 110d becomes greater than a short-circuit current threshold that is greater than the over current threshold, a short-circuit condition occurs in which both IGBT 110a and IGBT 110d are turned ON. The short-circuit detection circuit 127 determines that a short-circuit current is flowing to the IGBT 110d. The input terminal of the short-circuit detection circuit 127 is connected to one end of the current-sensing resistor 111d. The output terminal is connected to the control circuit 128.

The control circuit 128 controls the ON-drive constant-current circuit 121 and the OFF-drive circuit 122 based on a drive signal inputted from an external source, and drives the IGBT 110d. In addition, the control circuit 128 controls the OFF-holding circuit 123 based on the gate voltage of the IGBT 110d, and holds the OFF-state of the IGBT 110d. Furthermore, the control circuit 128 detects an abnormality in the ON-drive constant-current circuit 121 based on the drive signal and the voltage of the current control FET 121a. The control circuit 128 controls a component other than the OFF-drive FET 122a (other than the OFF-drive switching element), specifically, controls the OFF-holding FET 123a to turn OFF the IGBT 110d. The control circuit 128 also outputs an abnormality signal externally. Furthermore, when an abnormality occurs, such as an over current flowing to the IGBT 110d or the IGBT 110d entering the short-circuit condition, the control circuit 128 controls the blocking circuit 124 instead of the OFF-drive circuit 122 and turns OFF the IGBT 110d. The control circuit 128 is connected to respective gates of the current control FET 121a and the OFF-drive FET 122a. The control circuit 128 is also connected to the gate of the IGBT 110d, and to the gate of the OFF-holding FET 123a with the gate resistor 123b therebetween. The control circuit 128 is also connected to both ends of the current detection resistor 121b. In addition, the control circuit 128 is connected to respective output terminals of the over current detection circuit 126 and the short-circuit detection circuit 127, and the gate of the blocking FET 124a.

The drive power supply unit 120, the current control FET 121a, the OFF-drive FET 122a, the blocking FET 124a, the over current detection circuit 126, the short-circuit detection circuit 127, and the control circuit 28 are integrally configured as an integrated circuit (IC).

The control circuit 128 includes a current control circuit 1280 and an abnormality detection circuit 1281.

The current control circuit 1280 is a circuit that controls the ON-drive constant-current circuit 121. Specifically, when a drive signal gives a command to turn ON the IGBT 110d, the current control circuit 1280 controls the current control FET 121a based on the voltage of the current detection resistor 121b. More specifically, when the drive signal gives a command to supply the constant current from the ON-drive constant-current circuit 121 to the gate of the IGBT 110d, the current control circuit 1280 controls the current control FET 121a based on the voltage of the current detection resistor 121b. The current control circuit 1280 includes a resistor 1280a, a constant current source 1280b, and an operational amplifier 1280c.

The resistor 1280a and the constant current source 1280b are connected in series. One end of the resistor 1280a is connected to the end of the current detection resistor 121b which is connected to the drive power supply unit 120. One end of the constant current source 1280b is connected to the high-voltage-battery ground that is insulated from the vehicle body, and is connected to the negative terminal of the drive power supply unit 120 with the high-voltage battery ground therebetween.

The non-inverting input terminal of the operational amplifier 1280c is connected to the connection point between the resistor 1280a and the constant current source 1280b. The inverting input terminal is connected to the connection point between the current detection resistor 121b and the current control FET 121a. Furthermore, the output terminal is connected to the gate of the current control FET 121a.

The abnormality detection circuit 1281 is a circuit that detects an abnormality in the ON-drive constant-current circuit 121 based on the voltage of the current control FET 121a. The abnormality detection circuit 1281 includes an operational amplifier 1281a, resistors 1281b to 1281g, and an abnormality determination circuit 1281h.

The operational amplifier 1281a and the resistors 1281b to 1281e constitute a differential amplifier. The inverting input terminal of the operational amplifier 1281a is connected to a connection point between the current control FET 121a and the current detection resistor 121b via the resistor 1281b. That is to say, the inverting input terminal of the operational amplifier 1281a is connected to the source of the current control FET 121a. The wiring from the resistor 1281b to the connection point between the current control FET 121a and the current detection resistor 121b is arranged separately with the wiring from the operational amplifier 1280c of the current control circuit 1280 to the connection point between the current control FET 121a and the current detection resistor 121b. The non-inverting input terminal of the operational amplifier 1281a is connected to the drain of the current control FET 121a via the resistor 1281c. Also, the non-inverting input terminal of the operational amplifier 1281a is connected to the high-voltage battery ground which is isolated from the vehicle body via the resistor 1281d, and connected to the negative terminal of the drive power supply unit 120 via the high-voltage battery ground. Further, the output terminal of the operational amplifier 1281a is connected to the inverting input thereof via the resistor 1281e and the abnormality determination circuit 1281h.

One end of the resistor 1281f is connected to the anti-operational-amplifier side of the resistor 1281b. The other end is connected to the high voltage battery ground and connected to the negative terminal of the drive power supply unit 120 via the high voltage battery ground. One end of the resistor 1281g is connected to the anti-operational-amplifier side of the resistor 1281c. The other end is connected to the high voltage battery ground and connected to the negative terminal of the drive power supply unit 120 via the high voltage battery ground.

Thus, the source of the current control FET 121a is connected to the negative terminal of the drive power supply unit 120 via the resistor 1281f (first reference resistor). Moreover, the drain of the current control FET 121a is connected to the negative terminal of the drive power supply unit 120 via the resistors 1281c, 1281d and 1281g (second reference resistor).

The abnormality determination circuit 1281h judges the abnormality of the ON-drive constant-current circuit 121 based on the output of the operational amplifier 1281a and outputs an alert signal. In the abnormality determination circuit 1281h, a predetermined threshold voltage used for the judgment has been set. The input terminal of the abnormality determination circuit 1281h is connected to the output terminal of the operational amplifier 1281a.

With reference to FIG. 1, the motor control device is described as follows. When the ignition-switch (not shown) of the vehicle turn ON, the motor control device 1 as shown in FIG. 1 start to operate. The DC (direct current) high voltage of the high voltage battery B1 is smoothed by the smoothing capacitor 10. The motor control device 12 controls IGBT 110a to 110f which constitute the inverter 11 based on the drive signal sent by the external source. Specifically, the control device controls the IGBT 110a to 110f to be turned ON and OFF at a predetermined period. The inverter unit 11 converts the DC high voltage smoothed by the smoothing capacitor 10 into the three-phase AC voltage and supplies the vehicle-drive-motor M1 with the converted three-phase AC voltage. Thus, the motor control device 1 controls the vehicle-drive-motor M1.

Next, with reference to FIG. 2, a drive-operation of the IGBT is described as follows. As shown in FIG. 2, the control circuit 128 drives the current control FET 121a and the OFF-drive FET 122a so as to drive the IGBT 110d.

When the drive signal gives a command to turn ON the IGBT 110d, or in other words, gives an instruction to supply the constant current from the ON-drive constant-current circuit 121 to the gate of the IGBT 110d and turn OFF the OFF-drive FET 122a, the control circuit 128 controls the current control FET 121a based on the voltage of the current detection resistor 121b, supplies the constant current to the gate of the IGBT 110d, and turns OFF the OFF-drive FET 122a. As a result, a constant current that is the same as the output current of the constant current source 1280b is supplied from the ON-drive constant-current circuit 121 to the gate of the IGBT 110d, and the gate is charged with electrical charge. Therefore, the gate voltage becomes higher than the ON/OFF threshold voltage, and the IGBT 110d is turned ON.

On the other hand, when the drive signal gives a command to turn OFF the IGBT 110d, or in other words, gives an instruction to stop operation of the ON-drive constant-current circuit 121 and turn ON the OFF-drive FET 122a, the control circuit 128 stops the operation of the ON-drive constant-current circuit 121 and turns ON the OFF-drive FET 122a. As a result, electrical charge is discharged from the gate of the IGBT 110d via the OFF-drive resistor 122b. Therefore, the gate voltage becomes lower than the ON/OFF threshold voltage, and the IGBT 110d is turned OFF. Then, when the gate voltage reaches the OFF-holding threshold or lower, the OFF-holding threshold being lower than the ON/OFF threshold voltage, the control circuit 128 turns ON the OFF-holding FET 123a. As a result, electrical charge is further discharged from the gate of the IGBT 110d via the OFF-holding FET 123a, and the OFF-state of the IGBT 110d is held.

When the current flowing to the IGBT 110d becomes greater than the over current threshold, the over current detection circuit 126 determines that an over current is flowing to the IGBT 110d. When the current flowing to the IGBT 110d becomes greater than the short-circuit current threshold, the short-circuit detection circuit 127 determines that a short-circuit condition has occurred in which both the IGBT 110a and the IGBT 110d are turned ON. When determined that an abnormality has occurred, such as an over current flowing to the IGBT 110d or the IGBT 110d entering the short-circuit condition, the control circuit 128 turns ON the blocking FET 124a instead of the OFF-drive FET 122a. As a result, electrical charge is discharged from the gate of the IGBT 110d via the blocking resistor 124b. Therefore, the gate voltage becomes lower than the ON/OFF threshold voltage more gradually than when decreased by the OFF-drive circuit 122, and the IGBT 110d is turned OFF.

Next, an abnormality detection operation of the ON-drive constant-current circuit 121 will be described with reference to FIG. 2 to FIG. 3. Here, FIG. 3 is a flowchart for describing the abnormality detection operation of the ON-drive constant-current circuit.

As shown in FIG. 2, the differential amplifier configured by the operational amplifier 1281a and the resistors 1281b to 1281e amplifies the voltage between the source and the drain (voltage between the input terminal and the output terminal) of the current control FET 121a. As shown in FIG. 3, the abnormality determination circuit 1281f determines a faulty condition exists (S102) when the voltage between the source and the drain of the current control FET 121a is greater than a predetermined threshold voltage (S101) while the drive signal is giving a command to turn ON the IGBT 110d so as to allow the constant current to flow into the gate of the IGBT 110d from the ON-drive constant-current circuit 121 (S100). The faulty condition includes a short-circuit of the OFF-drive FET 122a or the OFF-drive FET 122a being turned ON due to a fault of the OFF-drive FET control portion of the control circuit 128. Further, when the voltage between the source and the drain (source-drain voltage) of the current control FET 121a is 0 volts (S103), the abnormality determination circuit 1281f determines that the current control FET 121a is in a short-circuit condition or the current detection resistor 121b has a open fault (S104). The abnormality determination circuit 1281f returns to step S100 when the above-described condition are not met and repeats the above-described procedures.

Figure 3:
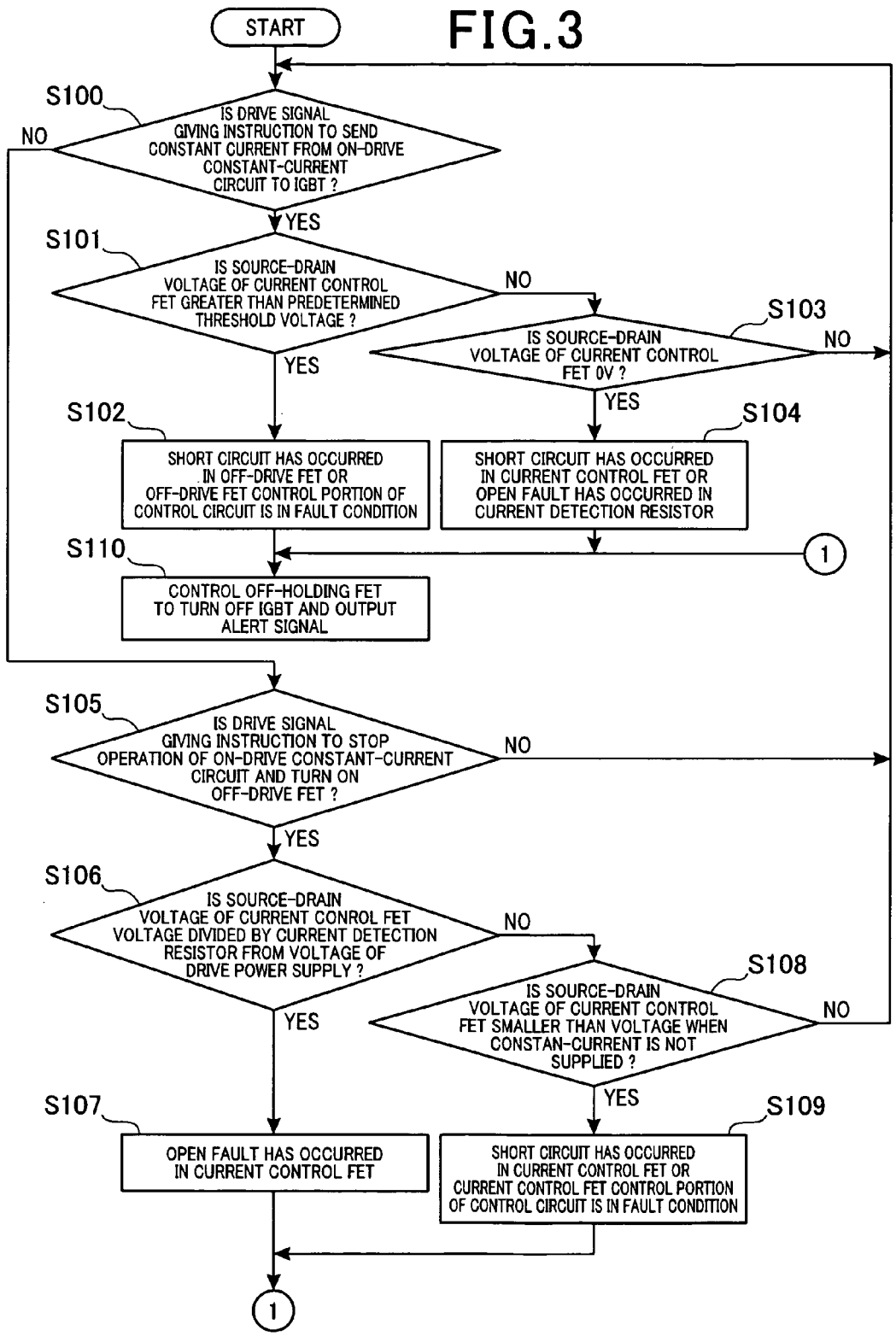
FIG. 3 is a flowchart showing an abnormality detecting procedure for ON-drive constant current circuit.

Meanwhile, as shown in FIG. 3, when the drive signal gives a command to turn OFF the IGBT 110d so as to stop operation of the ON-drive constant-current circuit 121 and when the drive signal gives a command to turn ON the OFF-drive FET 122a (S105), if the source-drain voltage of the current control FET 121a equals to a voltage divided by the current detection resistor 121b and the resistor 1281f from the voltage of the drive power supply unit 120 (S106), the abnormality determination circuit 1281f determines that the current control FET 121a has an open fault (S107). Further, when the source-drain voltage of the current control FET 121a is smaller than that of the current control FET 121a when the constant current is not flowing into the gate of the IGBT 110d (S108), the abnormality determination circuit 1281f determines that the current control FET 121a is in a short-circuit condition or the current control FET 121a is turning ON due to a fault of the control portion used for the current control FET 121a of the control circuit 128 (S109). The abnormality determination circuit 1281f returns to step S100 when the above-described conditions are not met and repeats the above-described procedures.

Then, when the abnormality determination circuit 1281f determines at least one of current control FET 121a, current detection resistor 121b and control circuit 128 is in a faulty condition, the control circuit 128 controls the OFF-holding FET 123a (except OFF-drive FET 122a) so as to turn OFF the IGBT 110d and outputs an alert signal via the abnormality determination circuit 1281f (S110).

Next, effects and advantages of the present invention are now described. According to the embodiment, the control circuit 28 detects abnormality of the ON-drive constant-current circuit 121 based on the source-drain voltage of the current control FET 121a (more particularly, based on the drive signal and the source-drain voltage of the current control FET 121a). When the current control FET 121a or the current detection resistor 121b of the ON-drive constant-current circuit 121 is in a faulty condition, current flowing through the current control FET 121a or the current detection resistor 121b and a voltage applied to such devices may change. Since the current flowing and the voltage change depending on state of the drive signal as well, abnormality of the ON-drive constant-current circuit 121 can be detected based on the source-drain voltage of the current control FET 121a (more particularly, based on the drive signal and the source-drain voltage of the current control FET 121a).

According to the embodiment, the control circuit 128 determines the current control FET 121a is in a short-circuit condition when the source-drain voltage of the current control FET 121a is 0 volts while the drive signal is giving a command to allow the constant current to flow into the gate of the IGBT 110d from the ON-drive constant-current circuit 121. While the drive signal is giving a command to allow the constant current to flow into the gate of the IGBT 110d from the ON-drive constant-current circuit 121, the source-drain voltage of the ON-drive constant-current circuit 121 becomes a predetermined value depending on an amount of the constant current flowing into the gate of the IGBT 110d. However, when the current control FET 121a is in a short-circuit condition, the source-drain voltage becomes 0 volts. Accordingly, if the source-drain voltage of the ON-drive constant-current circuit 121 is smaller than the source-drain voltage when the constant current is flowing into the gate of the IGBT 110d, the control circuit 128 determines the current control FET 121a is in a short-circuit condition.

According to the embodiment, the control circuit 128 determines that the OFF-drive FET 122a is in a short-circuit condition or the current control FET 121a is turning ON due to a fault of the OFF-drive FET control portion of the control circuit 128, when the source-drain voltage of the current control FET 121a is greater than a predetermined threshold voltage while the drive signal is giving a command to allow the constant current to flow into the gate of the IGBT 110d from the ON-drive constant-current circuit 121. While the drive signal is giving a command to allow the constant current to flow into the gate of the IGBT 110d from the ON-drive constant-current circuit 121, the source-drain voltage of the ON-drive constant-current circuit 121 becomes a predetermined value depending on an amount of the constant current flowing into the gate of the IGBT 110d. However, when the OFF-drive FET 122a is in a short-circuit condition or the OFF-drive FET 122a is turning ON due to a fault of the OFF-drive FET control portion of the control circuit 128, the source-drain voltage of the ON-drive constant current circuit 121 is greater than the predetermined threshold voltage. Accordingly, when the source-drain voltage of the current control FET 121a is greater than the predetermined threshold condition, the control circuit 128 can determine that the OFF-drive 122a is in a short-circuit condition or the OFF-drive FET 122a is turning ON due to a fault at the control portion used for the OFF-drive FET of the control circuit 128.

According to the embodiment, while the drive signal is giving a command to turn ON the OFF-drive FET 122a, if the source-drain voltage of the current control FET 121a is smaller than the source-drain voltage when the constant current is not flowing into the gate of the IGBT, the control circuit 128 determines that the current control FET 121a is a short-circuit condition or the current control FET 121a is turning ON due to a fault at the control portion used for the current control FET 121a of the control circuit 128. While the drive signal is giving a command to turn ON the OFF-drive FET 122a, the ON-drive constant-current circuit 121 stops current-flowing (constant current) into the gate of the IGBT so that the source-drain voltage of the current control FET 121a becomes a predetermined value corresponding to a value when the current-flowing is stopped. However, when the current control FET 121a is turned ON due to a short-circuit of the current control FET 121 or a fault of the control portion used for the current control FET 121a, the source-drain voltage becomes smaller than the voltage when the constant current is not flowing. Therefore, when the source-drain voltage of the current control FET 121a is smaller than the voltage when the constant current is not flowing, the control circuit 128 can determine the short-circuit fault of the current control FET 121a or fault at the control portion used for the current control FET 121a of the control circuit 128.

According to the embodiment, the source terminal of the current control FET 121a is connected to the positive terminal of the drive power supply unit 120 via the current detection resistor 121b and negative terminal of the drive power supply unit 120 via the resistor 1281f. Similarly, the drain terminal of the current control FET 121a is connected to the negative terminal of the drive power supply unit 120 via the resistors 1281c, 1281d and 1281g. Therefore, even when the ON-drive constant-current circuit 121 is in a faulty condition, the voltage of the source and the drain terminal of the current control FET 121a becoming unstable can be avoided. As a result, abnormalities of the ON-drive constant-current circuit 121 can be reliably detected based on the voltage of the current control FET 121a.

According to the embodiment, while the drive signal is giving a command to turn ON the OFF-drive FET 122a, if the source-drain voltage of the current control FET 121a equals to a voltage divided by the current detection resistor 121b and the resistor 1281f from the voltage of the drive power supply unit 120, the control circuit 128 determines that the current control FET 121a has an open fault. When the drive signal gives a command to turn ON the OFF-drive FET 122a, the ON-drive constant current circuit 121 stops current-flowing into the gate of the IGBT so that the source-drain voltage of the current control FET 121a becomes a predetermined value corresponding to a voltage value when the current-flowing is stopped. However, when the current control FET 121a has an open fault, since the source terminal is connected to the positive terminal of the drive power supply unit 120 via the current detection resistor 121b and connected to the negative terminal of the drive power supply unit 120 via the resistor 1281f, and the drain terminal is connected to the negative terminal of the drive power supply unit 120 via the resistors 1281c, 1281d and 1281g, the source-drain voltage of the current control FET 121a equals to a voltage divided by the current detection resistor 121b and the resistor 1281f from the voltage of the drive power supply unit 120. Accordingly, when the source-drain voltage of the current control FET 121a is a voltage divided from the drive power supply circuit 120 by the current detection resistors 121b and 1281f, the control circuit 128 can determine the open fault of the current control FET 121a.

According to the embodiment, while the drive signal is giving a command to allow the constant current to flow into the gate of the IGBT 110d from the ON-drive constant-current circuit 121, if the source-drain voltage of the current control FET 121a is 0 volts, the control circuit 128 determines the current detection resistor 121b has an open fault. When the drive signal gives a command to allow the constant current to flow into the gate of the IGBT 110d from the ON-drive constant-current circuit 121, the source-drain voltage of the current control FET 121a becomes a predetermined value corresponding to a voltage value when the constant current is flowing into the gate of the IGBT 110d. However, when an open fault occurs at the current detection resistor 121b, current does not flow through the current control FET 121a. Since the source terminal of the current control FET 121a is connected to the negative terminal of the drive power supply unit 120 via the resistor 1281f and the drain terminal of the current control FET 121a is connected to the negative terminal of the drive power supply unit 120 via the resistors 1281c, 1281d and 1281g, the source-drain voltage of the current control FET 121a becomes 0 volts. Accordingly, if the source-drain voltage of the current control FET 121a is 0 volts, the control circuit 128 can determine the current detection resistor 121b has an open fault.

According to the embodiment, the wiring from the connection point between the current control FET 121a and the current detection resistor 121b to the current control circuit 1280, and the wiring from the connection point between the current control FET 121a and the current detection resistor 121b to the abnormality detection circuit 1281, are arranged separately (i.e., not used as a single wiring). Therefore, even if the wiring between the current control FET 121a and the current control circuit 1280 is broken, abnormalities of the ON-drive constant-current circuit 121 can be detected.

According to the embodiment, when an abnormality of the ON-drive constant-current circuit 121 is detected by the control circuit 128, the control circuit 128 controls the IGBT 110d to be OFF by using the OFF-holding circuit 123 (except using OFF-drive FET 122a). As a result, thermal destruction of the IGBT 110d due to abnormality of the ON-drive constant-current circuit 121 can be avoided.

According to the embodiment, the control circuit 128 outputs an alert signal when an abnormality of the ON-drive constant-current circuit 121 is detected. Therefore, external devices can be notified of the abnormality of the ON-drive constant-current circuit.

According to the embodiment, the drive power supply unit 120, the current control FET 121a, the OFF-drive FET 122a, the blocking FET 124a, the over-current detecting circuit 126 and the control circuit 128 are integrated as an IC, however, the embodiment is not limited to this configuration. For example, when the current flowing into the IGBT is large, the current control FET can be disposed as an external device.

What is claimed is:

1. An electronic control apparatus comprising:
a switching element having a control terminal, the switching element being driven by a voltage at the control terminal;
an ON-drive constant-current circuit connected to the control terminal of the switching element, supplying a constant current to the control terminal thereby charging the control terminal of the switching element with electrical charge, the ON-drive constant-current circuit including a current control transistor that controls the current supplied to the control terminal of the switching element and a current detection element that detects the current flowing to the current control transistor, an input terminal of the current control transistor being connected to a drive power supply unit and an output terminal of the current control transistor being connected to the control terminal of the switching element, and the current detection element being connected to the current control transistor;
an OFF-drive switching element connected to the control terminal of the switching element, discharging electrical charge from the control terminal of the switching element by being turned ON; and
a control circuit adapted to control the ON-drive constant-current circuit and the OFF-drive switching element in response to a drive signal being inputted, thereby controlling the voltage of the control terminal of the switching element so as to drive the switching element, wherein
the control circuit controls the current control transistor based on the voltage of the current detection element and supplies the constant current to the control terminal of the switching element, and detects an abnormality in the ON-drive constant-current circuit based on a voltage between the input terminal of the current control transistor and the output terminal of the current control transistor.

2. The electronic control apparatus according to claim 1, wherein the control circuit detects an abnormality in the ON-drive constant-current circuit based on the drive signal and the voltage between the input terminal of the current control transistor and the output terminal of the current control transistor.

3. The electronic control apparatus according to claim 2, wherein the control circuit determines that a short-circuit has occurred in the current control transistor when the voltage between the input terminal and the output terminal of the current control transistor is 0 volts, while the drive signal is giving a command to supply the constant current from the ON-drive constant-current circuit to the control terminal of the switching element.

4. The electronic control apparatus according to claim 2, wherein while the drive signal is giving a command to supply the constant current from the ON-drive constant-current circuit to the control terminal of the switching element, when the voltage between the input terminal and the output terminal of the current control transistor is greater than a predetermined threshold voltage, the control circuit determines that a short-circuit has occurred in the OFF-drive switching element or that the OFF-drive switching element is turned ON due to a fault of a control portion in the control circuit that controls the OFF-drive switching element.

5. The electronic control apparatus according to claim 2, wherein while the drive signal is giving a command to turn ON the OFF-drive switching element, when the voltage between the input terminal and the output terminal of the current control transistor is smaller than the voltage when the constant current is not supplied to the control terminal, the control circuit determines that a short-circuit has occurred in the current control transistor or that the current control transistor is turned ON due to a fault of a control portion in the control circuit that controls the current control transistor.

6. The electronic control apparatus according to claim 2, wherein the input terminal of the current control transistor is connected to a positive terminal of the drive power supply unit via the current detection element and connected to a negative terminal of the drive power supply unit via a first reference resistor, and the output terminal of the current control transistor is connected to a negative terminal of the drive power supply unit via a second reference resistor.

7. The electronic control apparatus according to claim 6, wherein while the drive signal is giving a command to turn ON the OFF-drive switching element, when the voltage between the input terminal and the output terminal of the current control transistor is a voltage divided by the current detection element and the first reference resistor from a voltage of the drive power supply unit, the control circuit determines that an open fault has occurred in the current control transistor.

8. The electronic control apparatus according to claim 6, wherein the control circuit determines that an open fault has occurred in the current detection element when the voltage between the input terminal and the output terminal of the current control transistor is 0 volts, while the drive signal is giving a command to supply the constant current from the ON-drive constant-current circuit to the control terminal of the switching element.

9. The electronic control apparatus according to claim 1, wherein the control circuit includes:
   a current control circuit for controlling the current control transistor based on the voltage of the current detection element; and
   an abnormality detection circuit for detecting an abnormality in the ON-drive constant-current circuit based on the voltage between the input terminal and the output terminal of the current control transistor,
   and wiring from the current detection element to the current control circuit and the wiring from the current control transistor to the abnormality detection circuit are provided separately.

10. The electronic control apparatus according to claim 1, wherein the control circuit turns OFF the switching element by a component other than the OFF-drive switching element when an abnormality in the ON-drive constant-current circuit is detected.

11. The electronic control apparatus according to claim 10, wherein the electronic control apparatus includes an OFF-holding switching element connected to the control terminal of the switching element and adapted to discharge electrical charge from the control terminal of the switching element by being turned ON, and
   the control circuit is adapted to control the OFF-holding switching element such that when the voltage of the control terminal of the switching element becomes an OFF-holding threshold or less, the OFF-holding threshold being lower than an ON/OFF threshold voltage, the control circuit controls the OFF-holding switching element so as to hold the OFF-state of the switching element, and when an abnormality in the ON-drive constant-current circuit is detected, the control circuit controls the OFF-holding switching element so as to turn OFF the switching element.

12. The electronic control apparatus according to claim 1, wherein the control circuit outputs an abnormality signal when the control circuit detects an abnormality in the ON-drive constant-current circuit.

* * * * *